United States Patent
Teschner et al.

(10) Patent No.: US 8,980,072 B2
(45) Date of Patent: Mar. 17, 2015

(54) METHOD AND ARRANGEMENT FOR REDUNDANT ANODE SPUTTERING HAVING A DUAL ANODE ARRANGEMENT

(75) Inventors: Goetz Teschner, Dresden (DE); Enno Mirring, Arnsdorf (DE); Johannes Struempfel, Dresden (DE); Andreas Heisig, Dresden (DE)

(73) Assignee: VON ARDENNE Anlagentechnik GmbH, Dresden (DE)

( * ) Notice: Subject to any disclaimer, the term of this patent is extended or adjusted under 35 U.S.C. 154(b) by 409 days.

(21) Appl. No.: 12/679,736

(22) PCT Filed: Sep. 25, 2008

(86) PCT No.: PCT/EP2008/062881
§ 371 (c)(1),
(2), (4) Date: May 12, 2010

(87) PCT Pub. No.: WO2009/040406
PCT Pub. Date: Apr. 2, 2009

(65) Prior Publication Data
US 2010/0230275 A1   Sep. 16, 2010

(30) Foreign Application Priority Data

Sep. 25, 2007   (DE) .................. 10 2007 045 863

(51) Int. Cl.
*C23C 14/00* (2006.01)
*H01J 37/34* (2006.01)
(Continued)

(52) U.S. Cl.
CPC ............. *H01J 37/34* (2013.01); *C23C 14/3407* (2013.01); *C23C 14/564* (2013.01); *H01J 37/3438* (2013.01); *H01J 37/3444* (2013.01)
USPC ................................ 204/298.08; 204/298.01

(58) Field of Classification Search
CPC .................... H01J 37/32944; H01J 37/32045; H01J 37/3444
USPC ......................................... 204/298.08, 298.02
See application file for complete search history.

(56) References Cited

U.S. PATENT DOCUMENTS 5,126,032 A * 6/1992 Szczyrbowski et al. . 204/298.08
5,427,669 A   6/1995 Drummond
(Continued)

FOREIGN PATENT DOCUMENTS

DE   4233720 A1   4/1994
DE   4438463 C1   2/1996
(Continued)

OTHER PUBLICATIONS

Belkind A et al: "Dual-anode magnetron sputtering" Surface and Coatings Technology, Elsevier, Amsterdam, NL, vol. 163-164, Jan. 30, 2003, pp. 695-702, XP002427175 ISSN: 0257-8972.
(Continued)

*Primary Examiner* — Keith Hendricks
*Assistant Examiner* — Ibrahime A Abraham
(74) *Attorney, Agent, or Firm* — Heslin Rothenberg Farley & Mesiti P.C.

(57) ABSTRACT

In a method in which two anodes are operated alternately opposite each other as plasma discharge anodes and as cathodes for self-cleaning, and the cathodes of the plasma discharge are recurrently briefly reversed in polarity, and an arrangement comprising a cathode and a first and a second anode supplied with voltage by an H-bridge circuit, pole reversal of cathode voltage is effected by a pulse current supply, at least one anode is maintained at positive potential at all times and the other anode intermittently at negative potential during an etching time, and the H-bridge circuit is operationally connected to the pulse current supply, such that at least one anode is at positive potential at all times.

7 Claims, 3 Drawing Sheets

Figure 1:
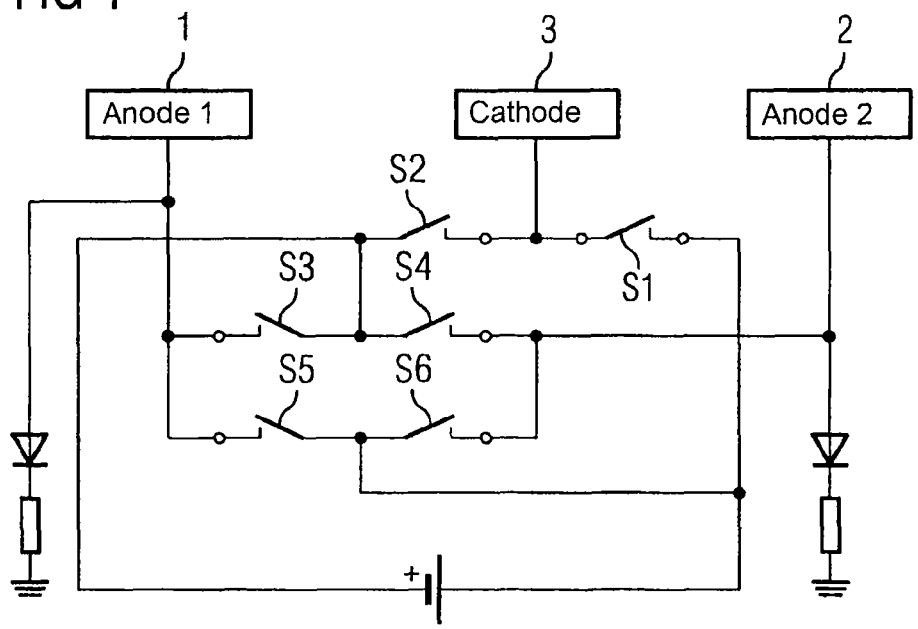

(51) Int. Cl.
*C23C 14/34* (2006.01)
*C23C 14/56* (2006.01)

(56) References Cited

U.S. PATENT DOCUMENTS

| | | | |
|---|---|---|---|
| 5,897,753 A | 4/1999 | Schatz et al. | |
| 6,183,605 B1 | 2/2001 | Schatz et al. | |
| 6,296,742 B1 * | 10/2001 | Kouznetsov | 204/192.12 |
| 2002/0104753 A1 * | 8/2002 | Kloeppel et al. | 204/192.12 |
| 2004/0004848 A1 * | 1/2004 | Yuzurihara et al. | 363/16 |
| 2007/0227876 A1 * | 10/2007 | Shamoun | 204/192.1 |
| 2008/0308410 A1 * | 12/2008 | Teschner et al. | 204/192.12 |

FOREIGN PATENT DOCUMENTS

| | | |
|---|---|---|
| DE | 19702187 A1 | 7/1998 |
| WO | WO9742647 A | 11/1997 |
| WO | 2006/099754 A1 | 9/2006 |
| WO | WO2007051461 A | 5/2007 |
| WO | WO 2007051461 A1 * | 5/2007 |

OTHER PUBLICATIONS

International Search Report and Written Opinion for PCT/EP2008/062881 dated Mar. 9, 2009.
German National Examination Report for 11 2008 002 242.9 dated Sep. 11, 2012.

* cited by examiner

METHOD AND ARRANGEMENT FOR REDUNDANT ANODE SPUTTERING HAVING A DUAL ANODE ARRANGEMENT

CROSS REFERENCE TO RELATED APPLICATIONS

This application is a national stage filing under section 371 of International Application No. PCT/EP2008/062881 filed on Sep. 25, 2008, and published in German on Apr. 2, 2009 as WO 2009/040406 A2 and claims priority of German application No. 10 2007 045 863.2 filed on Sep. 25, 2007, the entire disclosure of these applications being hereby incorporated herein by reference.

BACKGROUND ART

The invention relates to a method for redundant anode sputtering with a dual anode arrangement. According to this method, two anodes are operated alternately opposite each other as the anode of the plasma discharge and as the cathode for self-cleaning during the etching phase, and the cathode of the plasma discharge is recurrently reversed in polarity for a short period of time, in order to reduce the static charge.

The invention also relates to an arrangement that is intended for redundant anode sputtering with a dual anode arrangement and that comprises a vacuum chamber with a chamber wall, and therein arranged are also a cathode and a first and a second anode which [is supplied with voltage] by means of an H bridge circuit, which comprises a first bridge branch and a second bridge branch. In this case both bridge branches form together on the one side a plus connection, and on the other side both bridge branches form together a minus connection.

In a sputtering system a gas discharge is ignited between a cathode and an anode at a pressure of a few μbar. The material of the target, which forms the surface of the cathode that is exposed to the gas discharge, is stripped by an intensive ion bombardment. The cathode sputtering process generates a cloud of material vapor, which settles on all of the parts in the vacuum chamber. The aim of the design of sputtering systems is to collect on the substrate as much as possible of this material that has sputtered off and to allow as little as possible to land on the anodes. Since the deposition phase often produces, intentionally or unintentionally, poorly conducting or insulating materials, the current flow through the layered anode surface is significantly impeded with time so that the stability of the gas discharge is disturbed until totally quenched.

Long term stable processes, in which oxides or nitrides are deposited from a ceramic target at high sputtering rates, are a challenge for the design of a sputtering system.

The use of two anodes, which are operated alternately as the anode and as the cathode for self-cleaning, has already been known since the U.S. Pat. No. 6,183,605. The arrangement implements a redundant anode sputtering—that is, a cathode sputtering—with an additional anode. The drawback with this solution is the absence of means to control the etching effect in the presence of cathodically connected anodes.

The PCT application WO2007/051461 describes a control process for the etching effect. The document comprises two embodiments, with a medium frequency generator or with a DC power supply (direct voltage power supply), which divides in a pulsed manner the power between the cathode and the two anodes. In this case one of the solutions with a DC power supply provides a classical H bridge circuit comprising four switches, in particular comprising insulated gate bipolar transistors (IGBT), which effect, on the one hand, a polarity reversal of the anodes (electrodes) and, on the other hand, a short-term polarity reversal of the cathode, in order to extract the electrons from the remaining plasma and for discharging. This solution and its voltage behaviors are reproduced in FIG. 1 and FIG. 2.

In this case the commercially available DC power supplies with the principle of redundant anode sputtering are operated with two anodes (dual anodes). As a result, however, it is necessary to use switches, which effect the controlled changeover of the currents to the anodes, but are protected against the loading by the DC power supplies.

The U.S. Pat. No. 5,427,669 discloses a pulsed direct current power supply (pulsed power supply), which reverses the polarity of the cathode for a short period of time so that any charge to the cathode is discharged. Owing to the high du/dt values (voltage gradient) the short-term polarity reversal of the cathode generates in the circuit a dangerous load for the semiconductor switches, which are generally used in jumpers. In this case the term "short-term" means that the duration of the changeover pulse is less than the time until a next changeover pulse—thus, the time, in which the cathode voltage is negative.

In addition, this circuit is provided for a redundant anode sputtering, but not for use with dual anodes.

An additional risk, in particular for semiconductor components as switches, is the sudden quenching of the plasma as a result of, for example, too low pressure. This situation, which is called load shedding, produces extreme overvoltages, which lead to the destruction of semiconductor components, if it is not possible to limit the voltages.

BRIEF SUMMARY OF INVENTION

Working on this basis, the object of the invention is to improve the effect of redundant anode sputtering with dual anodes and to increase the component reliability.

The process-sided solution of the problem provides that the cathode and the anodes are fed from a pulsed power supply that effects the polarity reversal of the cathode voltage from the pulsed power supply, at least one anode being at positive potential at all times and the other anode being intermittently at negative potential during an etching phase. In contrast to the prior art, this method makes it possible to discharge the cathode by means of the voltage supply and also to conduct anode sputtering with dual anodes.

One embodiment of the method provides that the voltage at the cathode is reversed in polarity by means of the pulsed power supply with a voltage pulse, the pulse duration of which is less than half the time until the next pulse, preferably in an order of magnitude less.

It is possible that the cathode voltage is generated asynchronously in relation to the generation of the anode voltages. Therefore, it is not necessary to adapt both time behaviors to each other, a feature that reduces the complexity.

Since the anodes cannot be situated at the same place in the plasma, the rate, at which they are coated, varies.

As a result, the anodes need varying etching rates. One embodiment of the method makes it possible to configure the drive of the H bridge circuit in such a manner that the etching phases of the two anodes vary in their length of time.

In the case of substances with a residual conductivity totally clean etching is avoided because of the risk of removing the anode material. The etching time is adjusted in such a manner that a negligible coating is produced. In this case the criterion for the requisite etching time is the coating of the anodes, which can be recognized by eye due to the interference colors on the electrodes, so that in one embodiment of the invention the etching phases of the anodes are stopped as soon as the anodes show interference colors.

An additional variant of the method according to the invention provides that the frequency of alternating between etching phase and applying an anode voltage to the anodes is in a magnitude of 1 Hz to 10 kHz. The frequency for alternating between etching and anode effect is dictated by the properties of the coating produced on the anode. If it involves poorly conducting layers—for example, ZnO—then an alternate frequency of a few Hertz is sufficient. If it involves highly insulating layers, then an alternate frequency in a range of a few 10 kHz can be applied. The frequency has to be so high that the layer produced on the anode does not yet result in total insulation and, thus, prevents removal by etching. On the other hand, as the alternate frequency increases the results are unnecessary switching losses in the H bridge circuit. The frequency of 40 kHz is a good compromise for $SiO_2$.

The arrangement-sided solution of the problem provides that the DC power supply is configured as a pulsed power supply and that the H bridge circuit is connected to a clock generator and is operatively connected to the pulsed power supply in such a way that at least one anode is at positive potential at all times.

One embodiment of the arrangement according to the invention provides that a center point of the first bridge branch is connected to the first anode, and that a center point of the second bridge branch is connected to the second anode; that the plus connection of the H bridge circuit is connected to a plus output of the pulsed power supply; and that the minus connection of the H bridge circuit is connected to the minus output of the pulsed power supply which provides a voltage that produces a cleaning etching effect of the anodes during the etching phase.

Another embodiment provides that the center point of the first bridge branch is connected to the first anode by way of a first inductance, and that the center point of the second bridge branch is connected to the second anode by way of a second inductance. The two inductances serve to damp any feedback from the anode plasma into the switches.

The arrangement according to the invention can also be configured so as to connect from the first anode to the chamber wall a first series connection composed of a diode (Vhzh1) and a resistor (Rzh1) and from the second anode to the chamber wall a second series connection composed of a diode (Vhzh2) and a resistor (Rzh2). The combinations of diode and resistor—Vzh1–Rzh1 and/or Vzh2–Rzh2—serve, on the one hand, to facilitate the ignition, because a gas discharge in an arrangement with anodes that are not visible from the direction of the cathode is difficult to ignite and, on the other hand, together with the inductances L2 and L3 to damp any positive feedback from the plasma.

Another embodiment of the invention provides that the plus output of the pulsed power supply is connected capacitively to the vacuum chamber, in particular the chamber wall, by way of a capacitor. This strategy suppresses any deleterious transients (voltage spikes) in the plus branch.

An additional embodiment provides that a capacitor is connected between the plus connection and the minus connection. In this case the minus connection is connected to the minus output of the pulsed power supply by way of a rectifier chain and an inductance. Moreover, a series connection composed of a capacitor and a resistor is connected between the rectifier chain and the plus connection, as a result of which the inductance, the capacitor (C2) and the resistor form a combination that damps very fast voltage changes.

Since the process is supposed to operate without any synchronization between the drive of the H bridge and the pulsed power supply, the capacitor serves to charge the charge to the peak voltage, which is applied to the outputs of the pulsed power supply, by way of a rectifier chain $V1_1 \ldots V1_n$. The combination of L1-R2-C2 serves to damp very fast voltage changes, so that the rectifier chain $V1_1 \ldots V1_n$ is protected against very fast voltage changes.

BRIEF DESCRIPTION OF DRAWING FIGURES

Figure 2:
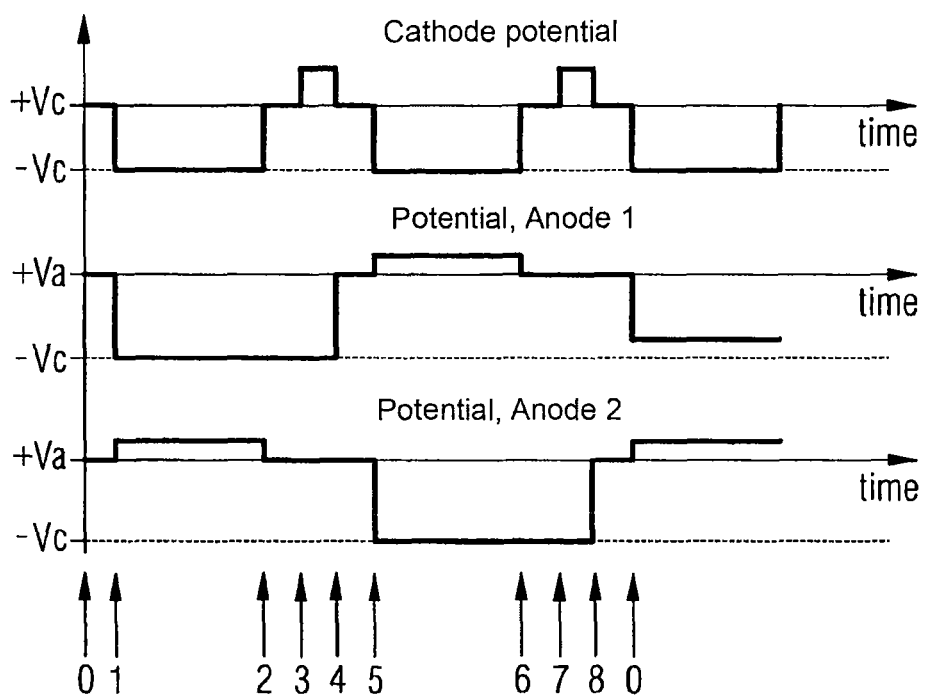

The invention is explained in detail below with reference to one embodiment. In the respective drawings FIG. 1 is a schematic drawing of the configuration of a comparable arrangement according to the prior art, FIG. 2 is a time-voltage curve of the arrangement according to FIG. 1, FIG. 3 is a schematic drawing of an arrangement according to the invention and FIG. 4 depicts the variation in time of the anode and cathode potential.

DETAILED DESCRIPTION

In order to implement the changeover of the anodes 1; 2, an H bridge circuit (V1 ... V4) with semiconductor switches is used, as used today in many current rectifiers and power supplies.

Figure 3:
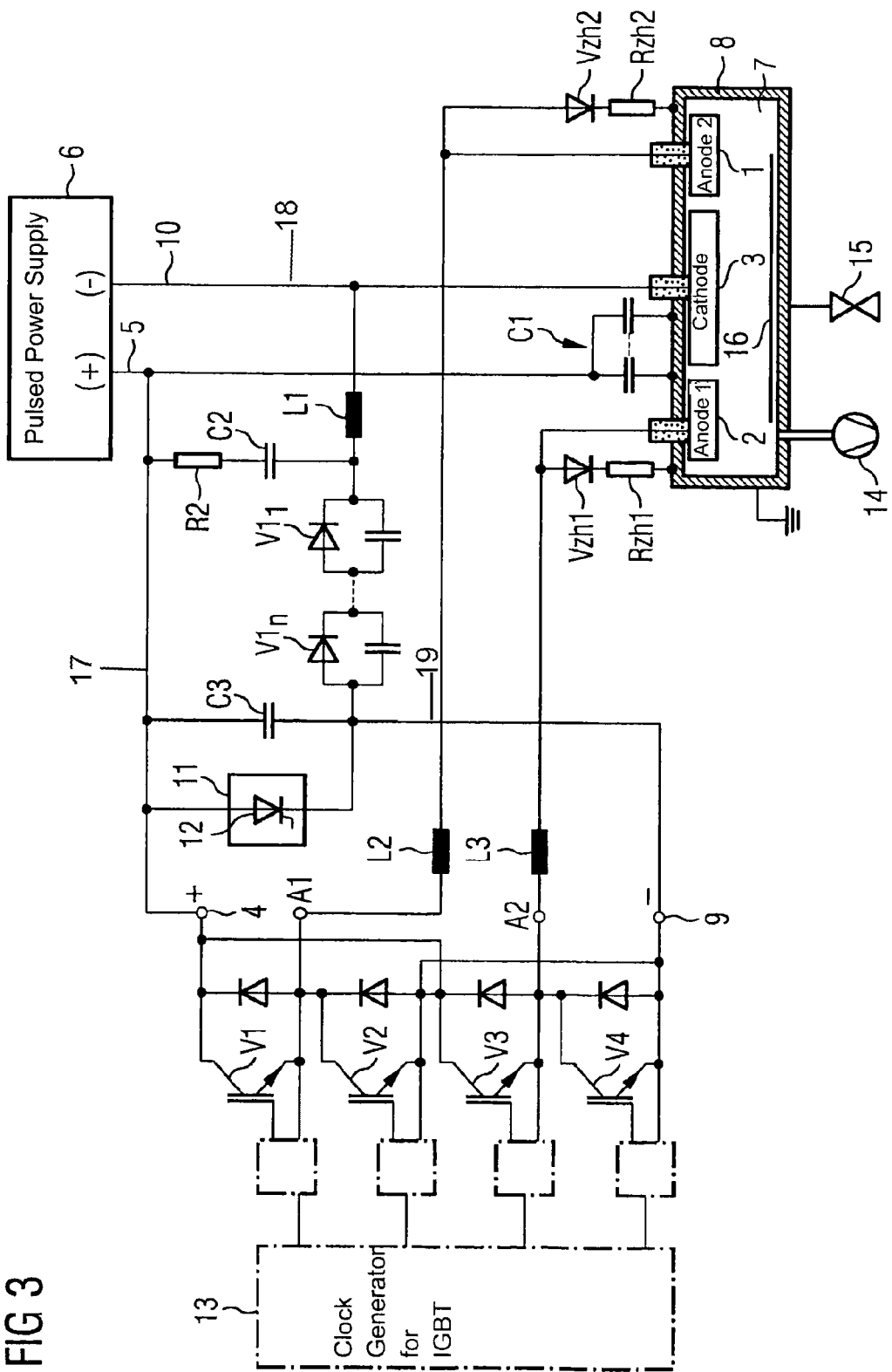
Figure 4:
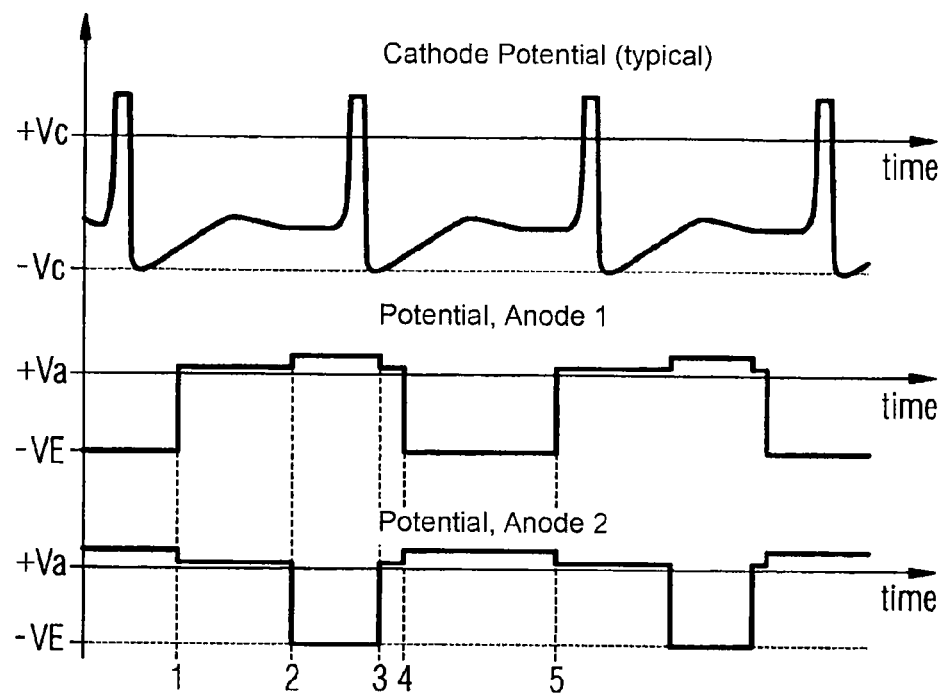

The center point of each bridge branch, identified with the reference numeral A1 and/or A2 in FIG. 3, is connected to the first anode 1 and/or the second anode 2 by way of the inductances L2 and L3. The two inductances L2 and L3 serve to damp any feedback from the anode plasma into the switches (V1 ... V4).

The combinations of diode and resistor—Vzh1–Rzh1 and/or Vzh2–Rzh2—serve, on the one hand, to facilitate the ignition, because a gas discharge in an arrangement with anodes 1; 2 that are not visible from the direction of the cathode 3 is difficult to ignite and, on the other hand, together with the inductances L2 and L3 to damp any positive feedback from the plasma.

The plus connection 4 of the H bridge circuit (V1 ... V4) is connected directly to the plus output 5 of the pulsed power supply 6 by a first conductor 17. In order to suppress any deleterious transients (voltage spikes) in the plus branch, this plus branch was connected capacitively to the vacuum chamber 7, in particular the chamber wall 8, by way of a capacitor block C1. These capacitors C1 have to exhibit an adequately small self-inductance so that even in the event of fast changes in the output voltage of the pulsed power supply 6 only harmless voltage changes in the plus branch are generated. The minus output 10 of the pulsed power supply 6 is connected to the cathode 3 by a second conductor 18.

The minus connection 9 of the H bridge circuit (V1 ... V4) has to be fed voltage that effects the cleaning of the anodes 1; 2 during the etching phase.

Since the process is supposed to operate without any synchronization between the drive of the H bridge circuit (V1 ... V4) and the pulsed power supply 6, a storage capacitor C3 was introduced. This storage capacitor was connected to the plus connection 4 via the first conductor 17 and to the minus connection 9 of the H bridge circuit (V1 ... V4) by a third conductor 19. This capacitor C3 is charged via a rectifier chain $V1_1 \ldots V1_n$ to the peak voltage that is applied to the output terminals of the pulsed power supply. The combination of L1-R2-C2 serves to damp very fast voltage changes so that the rectifier chain $V1_1 \ldots V1_n$ is protected against very fast voltage changes.

In the case of an overvoltage at the output of the pulsed power supply 6 between the plus output 5 and a minus output 10 of the pulsed power supply 6, the capacitor C3 would have an inadmissibly higher charge. For this reason an overvoltage protection 11 was arranged parallel to the capacitor C3. This overvoltage protection ignites a thyristor 12, when the voltage at the capacitor C3 exceeds a preset threshold value. Hence, the pulsed power supply 6 is short circuited by way of the rectifiers $V1_1 \ldots V1_n$ and the inductance L1. This short circuiting is detected by the pulsed power supply 6, which switches off the current.

The drive 13 of the H bridge circuit (V1 ... V4) exhibits a special feature. It must always be guaranteed, as shown in the time diagram in FIG. 4, that the connection of at least one anode 1; 2 to the plus output 5 of the pulsed power supply 6 is guaranteed. The time diagram shows that immediately before time point 1 the second anode 2 ("anode 2") carries the main current of the discharge, whereas the first anode 1 ("anode 1") is at negative potential and is, thus, cleaned. Thus, up to time point 1 the switches V2 and V3 are conductive, and V1 and V4 are closed. At time point 1 the switch V2 is closed, so that the negative potential at the first anode 1 ("anode 1") decreases. Since at this point there is no electrical connection, the first anode 1 ("anode 1") assumes for a short period of time a potential that is in the vicinity of the plasma potential. Following a time delay in switching (not shown) that was introduced in order to eliminate shoot-through problems in the H bridge circuit as a result of the component tolerances, the switch V1 becomes conductive. At this point both the switch V1 and the switch V3 are conductive so that both anodes 1; 2 are involved in carrying the current of the discharge. This state can be recognized in the decrease in the anode voltage.

At time point 2 the switch V3 is closed, so that the anode voltage rises again, and after a time delay V4 in switching, becomes conductive so that the etching process at the second anode 2 ("anode 2") starts. At time point 3 the etching of the second anode 2 ("anode 2") ends again in that the switch V4 is closed, and after the time delay V3 in switching, becomes conductive so that again both anodes 1; 2 carry the discharge current.

At time point 4 the first anode 1 ("anode 1") is applied again to the negative potential so that it is etched up to time point 5.

The sequence of events at time point 5 corresponds to those at time point 1.

Since the anodes 1; 2 cannot be situated at the same place in the plasma, the rate, at which they are coated, varies.

As a result, the anodes 1; 2 require varying etching rates. The drive 13 of the H bridge circuit is configured so as to produce different etching times—time points 2-3 and/or time points 4-5. Owing to the changeover steps the maximum etching period is somewhat less than the maximum anode period. If the etching time is decreased, then the time, in which both anodes, connected in parallel, act as the anode of the discharge, increases.

The criterion for the requisite etching time is the coating of the anodes 1; 2, which can be recognized by eye due to the interference colors on the anodes 1; 2.

In the case of substances with a residual conductivity totally clean etching is avoided because of the risk of removing the anode material. The etching time is adjusted in such a manner that the result is a negligible coating that allows a stable operation between two maintenance cycles.

The frequency for alternating between etching and anode effect is dictated by the properties of the coating produced on the anode 1; 2. If it involves poorly conducting layers—for example, ZnO—then an alternate frequency of a few Hertz is sufficient. If it involves highly insulating layers, then an alternate frequency in a range of a few 10 kHz can be applied. The frequency has to be so high that the layer produced on the anode 1; 2 does not yet result in total insulation and, thus, prevents removal by etching. On the other hand, as the alternate frequency increases, there are unnecessary switching losses in the H bridge circuit. The frequency of 40 kHz is a good compromise for $SiO_2$.

The vacuum chamber 7 is evacuated using a vacuum pump 14. This vacuum chamber can be vented again by means of a gas inlet 15. The substrate 16 that is to be coated is situated opposite the cathode 3 in the vacuum chamber 7.

The invention claimed is:

1. Apparatus for redundant anode sputtering with a dual anode arrangement, comprising: a vacuum chamber with a chamber wall and, having, arranged in the chamber, a cathode and a first electrode and a second electrode supplied with voltage by an H bridge circuit, the circuit comprising a first bridge branch and a second bridge branch, wherein both bridge branches form together on one side a first terminal, and on another side both bridge branches form together a second terminal, and a pulsed DC power supply, wherein a center point of the first bridge branch is connected to the first electrode, and a center point of the second bridge branch is connected to the second electrode, the first terminal of the H bridge circuit being connected to a plus output of the pulsed DC power supply by a first conductor, and the second terminal of the H bridge circuit being connected to a minus output of the pulsed DC power supply which provides a voltage that produces a cleaning etching effect of the electrodes during an etching phase, wherein potential of the cathode is derived from the pulsed DC power supply via a second conductor connecting the minus output of the pulsed DC power supply to the cathode, and potential of the first electrode and the second electrode is derived from the pulsed DC power supply by the H bridge circuit, wherein the H bridge circuit is connected to a clock generator and is operatively connected to the pulsed DC power supply such that at least one of the first electrode and the second electrode is at positive potential at all times, wherein voltage supplied to the cathode from the pulsed DC power supply by said second conductor is generated asynchronously relative to generation of voltages supplied to the first electrode and the second electrode by the H bridge circuit, wherein a first storage capacitor is connected between the first terminal and the second terminal with a first end of the first storage capacitor connected to the first conductor, and with a second end of the first storage capacitor connected to the second terminal by a third conductor, the first storage capacitor decoupling generation of the voltage supply to the cathode from the voltages supplied to the electrodes such that the voltage supply to the cathode is generated asynchronously relative to generation of the voltages supplied to the first electrode and the second electrode, and wherein the second terminal is connected to the minus output of the pulsed DC power supply by a first series connection of rectifiers and an inductor with a first end of the first series connection connected to the third conductor and a second end of the first series connection connected to the second conductor, a second series connection of a second capacitor and a resistor is connected from a point located between the rectifiers and the inductor of the first series connection to the first conductor, and wherein the inductor, the second capacitor and the resister form a combination that damps very fast voltage changes, and the first storage capacitor is charged via the rectifiers of the first series connection to a peak voltage applied to output terminals of the pulsed DC power supply.

2. Apparatus, as claimed in claim 1, wherein the center point of the first bridge branch is connected to the first electrode by a first inductance, and the center point of the second bridge branch is connected to the second electrode by a second inductance.

3. Apparatus, as claimed in claim 1, wherein from the first electrode to the chamber wall a third series connection of a diode and a resistor is connected, and from the fourth electrode to the chamber wall a second series connection of a diode and a resistor is connected.

4. Apparatus, as claimed in claim 1, wherein the plus output is connected capacitively to the vacuum chamber.

5. Apparatus, as claimed in claim 4, wherein the first terminal is connected to the chamber wall by a capacitor.

6. Apparatus as claimed in claim 1, further comprising an overvoltage protection component arranged parallel to the first storage capacitor, and a thyristor ignited by the overvoltage protection component when voltage at the first storage capacitor exceeds a preset threshold voltage, and wherein the ignited thyristor short circuits the pulsed DC bower supply.

7. Apparatus as claimed in claim 6, wherein the pulsed DC power supply is adapted to detect short circuiting and, in response, switch off current.

* * * * *